United States Patent
Bisschops et al.

(10) Patent No.: US 6,603,130 B1
(45) Date of Patent: Aug. 5, 2003

(54) GAS BEARINGS FOR USE WITH VACUUM CHAMBERS AND THEIR APPLICATION IN LITHOGRAPHIC PROJECTION APPARATUSES

(75) Inventors: Theodorus H. J. Bisschops, Eindhoven (NL); Jakob Vijfvinkel, Eindhoven (NL); Hermanus M. J. R. Soemers, Mierlo (NL); Johannes C. Driessen, Eindhoven (NL); Michael J. M. Renkens, Geleen (NL); Adrianus G. Bouwer, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/551,223

(22) Filed: Apr. 17, 2000

(30) Foreign Application Priority Data

Apr. 19, 1999 (EP) .............................. 99201193

(51) Int. Cl.[7] ............................... H01J 37/20
(52) U.S. Cl. ................. 250/492.1; 250/492.2; 250/492.21; 250/492.22; 250/492.3; 250/440.11; 250/441.11; 250/442.11; 355/53; 355/72; 355/76
(58) Field of Search ................. 250/440.11, 441.11, 250/442.11, 492.1, 492.2, 492.21, 492.22, 492.3; 355/53, 72, 76; 310/10, 12

(56) References Cited

U.S. PATENT DOCUMENTS

| | | | |
|---|---|---|---|
| 4,118,042 A | 10/1978 | Booth | |
| 4,191,385 A | 3/1980 | Fox et al. | |
| 4,229,655 A | 10/1980 | Ryding | |
| 4,726,689 A | 2/1988 | Pollock | |
| 5,218,896 A | 6/1993 | Furukawa | |
| 5,898,179 A * | 4/1999 | Smick et al. | 250/492.21 |
| 6,274,875 B1 * | 8/2001 | Smick et al. | 250/492.21 |
| 6,323,496 B1 * | 11/2001 | Sakase et al. | 250/492.21 |
| 6,337,484 B1 * | 1/2002 | Loopstra et al. | 250/442.11 |
| 6,421,112 B1 * | 7/2002 | Bisschops et al. | 355/53 |
| 6,445,440 B1 * | 9/2002 | Bisschops et al. | 355/53 |

FOREIGN PATENT DOCUMENTS

| | | |
|---|---|---|
| EP | 1 089 001 A1 | 4/2001 |
| WO | 98/28665 | 7/1998 |
| WO | 98/40791 | 9/1998 |
| WO | 99/66221 | 12/1999 |

OTHER PUBLICATIONS

Ceglio et al., "Front–end design issues in soft–x–ray projection lithography," *Applied Optics*, Optical Society of America, Washington, US, vol. 32, No. 34, Dec. 1, 1993, pp. 7050–7056 (Abstract No. XP000414608 ISSN: 0003–6935).

* cited by examiner

*Primary Examiner*—John R. Lee
*Assistant Examiner*—David A. Vanore
(74) *Attorney, Agent, or Firm*—Pillsbury Winthrop LLP

(57) ABSTRACT

A bearing for use in a vacuum chamber comprises a gas bearing discharging pressurised gas into a gap between two members to maintain a predetermined separation between those members. To avoid the gas forming the gas bearing being an unacceptable leak into the vacuum chamber, a vacuum pump is provided between the vacuum chamber and the gas bearing.

25 Claims, 3 Drawing Sheets

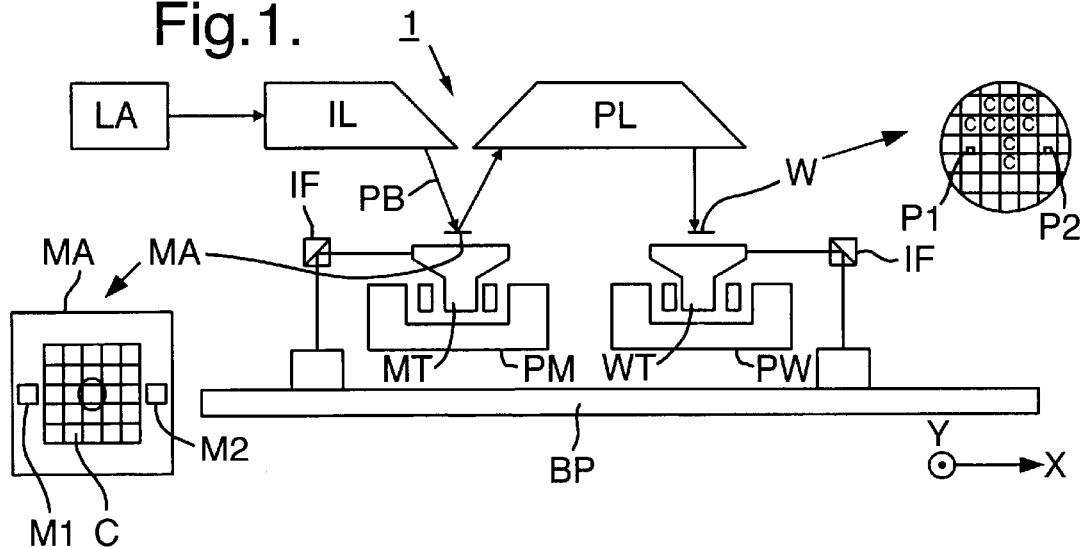
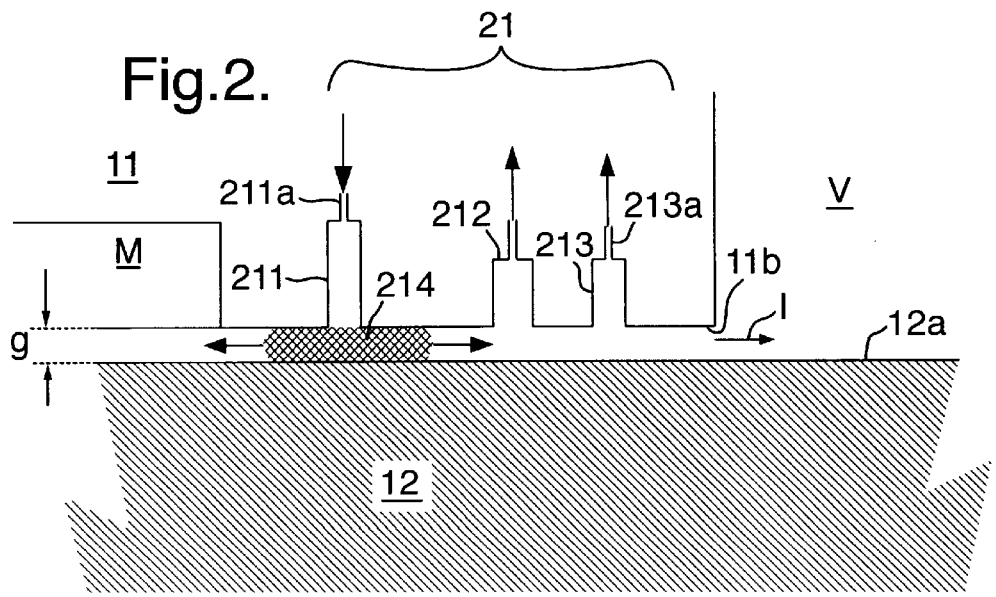
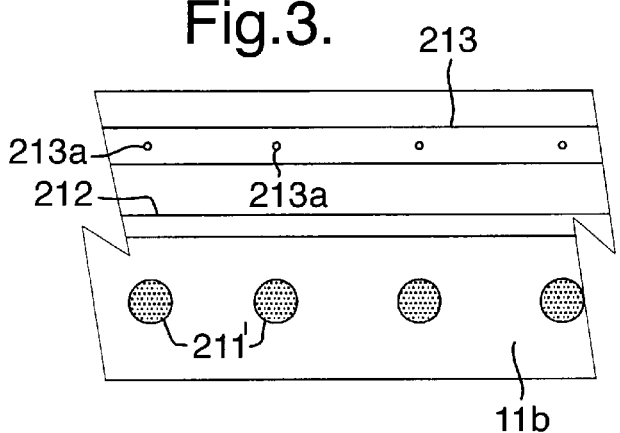
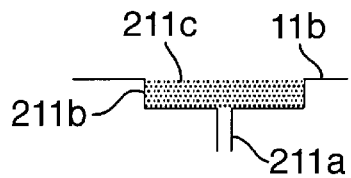

GAS BEARINGS FOR USE WITH VACUUM CHAMBERS AND THEIR APPLICATION IN LITHOGRAPHIC PROJECTION APPARATUSES

BACKGROUND OF THE INVENTION

1. Field of the Invention

The present invention relates to bearings for use in vacuum chambers. More particularly, the invention relates to the application of such a device in lithographic projection apparatuses.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatuses employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated, and optical elements for EUV radiation can be spoiled, by the deposition of carbon layers on their surface, which imposes the additional requirement that hydrocarbon partial pressures should generally be kept below $10^{-8}$ or $10^{-9}$ millibar. Otherwise, for apparatuses using EUV radiation, the total vacuum need pressure only be $10^{-3}$ or $10^{-4}$ mbar, which would typically be considered a rough vacuum.

Further information with regard to the use of electron beams in lithography can be gleaned, for example, from U.S. Pat. No. 5,079,122 and U.S. Pat. No. 5,260,151, as well as from EP-A-0 965 888.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimise or eliminate contaminant and total outgassing, i.e. both outgassing from the materials themselves and from gases adsorbed on their surfaces, should be used. It would be very desirable to be able to reduce or circumvent such restrictions.

Bearings in vacuum are a particular problem. Most lubricants are unsuitable for use in high vacuum conditions, particularly when low hydrocarbon partial pressures are required. Unlubricated bearings are known, but are subject to wear and cannot meet the speed of operation and lifetime requirements of lithography apparatuses. It is also difficult with conventional bearings to reduce the bearing gap below about 30 $\mu$m. Such a gap around a motion feed-through into the vacuum chamber would present an unacceptable leak.

SUMMARY OF THE INVENTION

It is an object of the present invention to provide an improved bearing that can be used in a vacuum chamber of a lithographic projection apparatus, e.g. to support a slidable plate sealing an aperture in the vacuum chamber, a member passing through an aperture in the vacuum chamber or a moveable object within the vacuum chamber, and can operate at high speed for a very great number of cycles.

According to the present invention, these and other objects are achieved in a lithographic projection apparatus that has:
- a radiation system for supplying a projection beam of radiation;
- a first object table provided with a mask holder for holding a mask;
- a second object table provided with a substrate holder for holding a substrate; and
- a projection system for imaging an irradiated portion of the mask onto a target portion of the substrate, the lithographic projection apparatus has a vacuum chamber having a wall enclosing at least one of the first and second object tables, the vacuum chamber wall having an aperture therein;

a moveable sealing member for sealing the aperture;

a bearing for bearing the sealing member and maintaining a gap, between the sealing member and the vacuum chamber wall, the bearing including
 a gas bearing for providing pressurised gas into the gap thereby to generate forces tending to hold the sealing member away from said vacuum chamber wall; and
 an evacuation component spaced apart from the gas bearing for removing the gas from the gap.

Another aspect of the invention provides a lithographic projection apparatus that is:

a radiation system for supplying a projection beam of radiation;

a first object table provided with a mask holder for holding a mask;

a second object table provided with a substrate holder for holding a substrate; and a projection system for imaging an irradiated portion of the mask onto a target portion of the substrate. The lithographic projection apparatus also has a vacuum chamber having a wall enclosing at least one of the first and second object tables, the one object table being movable;

a bearing for displaceably bearing the one object table against a bearing surface within the vacuum chamber and maintaining a gap therebetween, the bearing including a gas bearing for providing pressurised gas into the gap thereby to generate forces tending to separate the borne and bearing members; and an evacuation component spaced apart from the gas bearing for removing gas from the gap, the evacuating component being provided to surround the gas bearing.

Current lithography apparatuses are designed for use in clean room environments and therefore some steps have conventionally been taken to reduce possible sources of contamination of wafers that are processed by the apparatus. However, conventional designs of wafer, mask and transfer stages are very complicated and employ large numbers of components for sensor and drive arrangements. Such stages also need to be provided with large numbers of signal and control cables and other utilities. The present invention avoids the difficult and detailed task of making such large numbers of components vacuum-compatible, or replacing them with vacuum-compatible equivalents, by adopting the principle of locating as many components and functions as possible outside the vacuum chamber. The present invention thus avoids the need to vacuum-proof many or most of the numerous components, by providing appropriate mechanical feed-throughs with innovative sealing arrangements. Likewise, the present invention avoids difficulties in reducing vibrations inevitable in vacuum apparatuses, particularly where powerful pumps are provided, by isolating as far as possible vibration sensitive components from the vacuum chamber wall.

The gas bearing of the invention maintains the desired separation between the borne and bearing members (e.g. the sealing member and the vacuum chamber wall or the object table and bearing surface in the vacuum chamber), whilst the evacuation component prevents the gas forming the gas bearing being an unacceptable leak into the vacuum chamber. The vacuum bearing of the invention has many applications, for example supporting a sliding seal plate, supporting a rod of a motion feed-through into the vacuum chamber, supporting, an object or object table that must move on the vacuum chamber floor, or allowing a support pillar to be isolated from the vacuum chamber wall.

The evacuation component may comprise an elongate groove located in one surface defining the gap and connected by spaced-apart vacuum conduits to a vacuum pump. Alternatively, multiple parallel grooves may be provided and connected to separate vacuum pumps, with those grooves nearer the vacuum chamber drawing a deeper vacuum.

According to a further aspect of the invention there is provided a method of manufacturing a device using a lithographic projection apparatus that has:

a radiation system for supplying a projection beam of radiation;

a first object table provided with a mask holder for holding a mask;

a second object table provided with a substrate holder for holding a substrate; and a projection system for imaging an irradiated portion of the mask onto a target portion of the substrate. The lithographic projection apparatus also has a vacuum chamber having a wall enclosing at least one of the first and second object tables, the vacuum chamber wall having an aperture therein;

a moveable sealing member for sealing the aperture;

a bearing for bearing the sealing member and maintaining
 a gap between the sealing member and the vacuum chamber wall, the bearing comprising:
  a gas bearing for providing pressurised gas into the gap thereby to generate forces tending to hold the sealing member away from the vacuum chamber wall; and
  evacuation means spaced apart from the gas bearing for removing the gas from the gap; the method includes
   mounting a mask on said first object table;
   mounting a substrate on the second object table; and
   exposing the substrate to an image of the mask.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 007-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which:

FIG. 1 depicts a lithographic projection apparatus according to a first embodiment of the invention;

FIG. 2 is a cross-sectional view of a differential gas bearing according to a second embodiment of the invention;

FIG. 3 is a plan view of a variation of the differential gas bearing of FIG. 2;

FIG. 3A is an enlarged cross-section of part of the differential gas bearing of FIG. 3;

In the various drawings, like parts are indicated by like references.

DETAILED DESCRIPTION OF THE PREFERRED EMBODIMENTS

Embodiment 1

Figure 4:
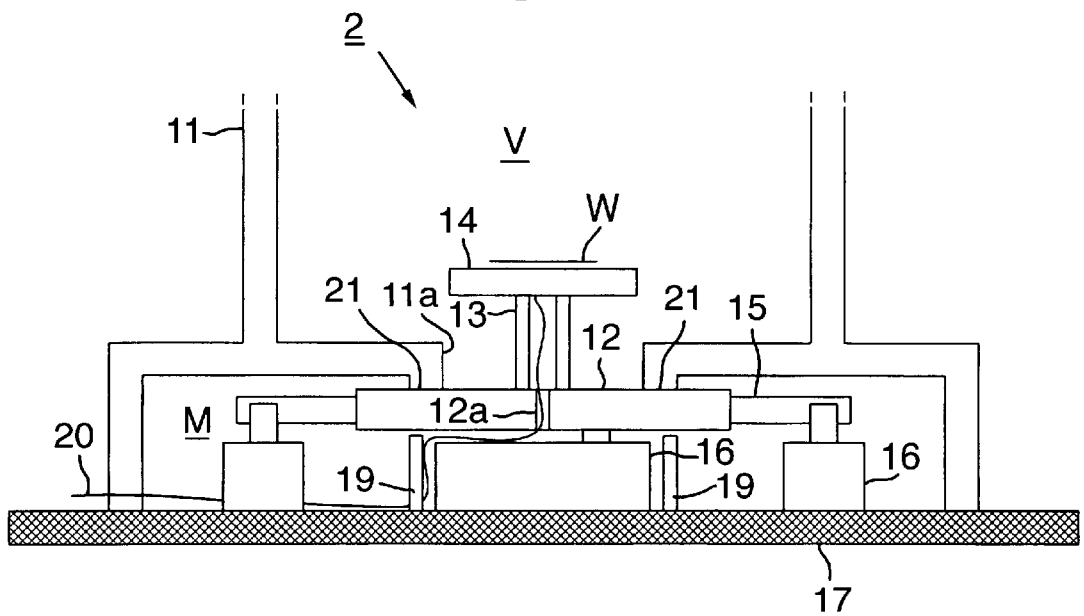
FIG. 4 is a cross-sectional view of a wafer stage of a lithographic apparatus according to a third embodiment of the present invention.

FIG. 1 schematically depicts a lithographic projection apparatus 1 according to the invention. The apparatus comprises:

- a radiation system LA, IL for supplying a projection beam PB of radiation (e.g. UV or EUV radiation, electrons or ions);
- a first object table (mask table) MT provided with a mask holder for holding a mask MA (e.g. a reticle), and connected to a first positioning component PM for accurately positioning the mask with respect to item PL;
- a second object table (substrate table) WT provided with a substrate holder for holding a substrate W (e.g. a resist-coated silicon wafer), and connected to a second positioning component means PW for accurately positioning the substrate with respect to item PL;
- a projection system ("lens") PL (e.g. a refractive or catadioptric system, a mirror group or an array of field deflectors) for imaging an irradiated portion of the mask MA onto a target portion C (die) of the substrate W.

The radiation system comprises a source LA (e.g. an undulator or wiggler provided around the path of an electron beam in a storage ring or synchrotron, a plasma source or an electron or ion beam source) which produces a beam of radiation. This beam is passed along various optical components included in illumination system IL, e.g. for the purpose of shaping and/or collimating the resultant beam PB, and/or making it uniformly intense throughout its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target area C of the substrate W. With the aid of the positioning component PW and the interferometric displacement measuring device IF, the substrate table WT can be moved accurately, e.g. so as to position different target areas C in the path of the beam PB. Similarly, the positioning means PM and the interferometric displacement measuring device IF can be used to accurately position the mask MA with respect to the path of the beam PB, e.g. after mechanical retrieval of the mask MA from a mask library or during a scanning motion. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the lens PL (e.g., M=¼ or ⅕). In this manner, a relatively large target area C can be exposed, without having to compromise on resolution.

Embodiment 2

A gas bearing 21 ("air bearing") according to a second embodiment of the invention is generally depicted in FIG. 2. FIG. 2 is a cross-section through a differential gas-bearing 21, showing part of a supporting member, e.g. vacuum chamber wall 11, and a supported member, e.g. a sliding seal plate 12. Gas bearing 21 holds the plate 12 off the vacuum chamber wall by a constant gap, g, of 5 $\mu$m, for example. For such a gap, the surface 11b of the vacuum chamber wall in the vicinity of the bearing, and the surface 12a of the supported member over the area of travel of the bearing, must be finished to an RMS surface roughness of less than 0.8 $\mu$m, though they need not be flatter than 0.4 $\mu$m RMS surface roughness. This can readily be achieved with known mechanical polishing techniques. In some applications a gap in the range of from 5 $\mu$m to 10 $\mu$m may be appropriate and the surfaces need not be finished to such high tolerances. Clean air (or other gas, e.g. $N_2$) is supplied continually through gas feed 211 at a pressure of several atmospheres to generate a high pressure region 214. The supplied air will flow towards a compartment M and also the vacuum chamber V, where its presence would, of course, be undesirable. An escape path to atmospheric pressure is provided via groove 212. To prevent further the air that forms the air bearing becoming an unacceptable leak into the vacuum chamber V, it is pumped away via vacuum conduit 213. If desired, the escape path 212 may also be pumped. In this way, the residual leakage, 1, into the vacuum chamber V can be kept within acceptable levels.

In this embodiment the lower parts of the air feed 211 and the vacuum conduit 213 as well as the escape path 212 are elongate grooves extending along the entire length of the perimeter of the seal. Air feed pipes 211a and vacuum pipes 213a are provided at intervals along the grooves.

In a variation to the second embodiment, shown in FIG. 3, which is a view from below of a part of the vacuum wall 11, the gas feeds 211' that provide the gas bearing are discrete. At the end of each gas feed pipe 211a there is an enlargement 211b, shown in cross-section in FIG. 3A, that is filled with a porous plug 211c. The enlargement may be cylindrical or any other convenient shape and may be omitted if desired. The porous plug 211c is preferably made of graphite, which enables it to be placed in the enlargement 211b after machine finishing of the lower surface 11b of the vacuum wall 11, and then scraped smooth.

In both variants of the gas bearing described above, a single vacuum groove 213 is provided between the air feed 211 and the vacuum chamber V. In other variants, two or more vacuum grooves may be provided, with those nearer the vacuum chamber V being pumped to higher vacuum levels.

Embodiment 3

Part of a lithographic projection apparatus 2 according to a third embodiment of the invention is shown schematically and in cross-section in FIG. 4. This embodiment of the invention additionally makes use of a sliding seal concept further described in European Patent Application No. 99201220.3 entitled "Motion Feed-Through into a Vacuum Chamber and its Application in Lithographic Apparatus" and a concurrently filed U.S. application of similar title (Applicant's ref: P-0130-010) which are incorporated herein by reference. The vacuum chamber V is bounded by walls 11 which define an aperture 11a in the floor of the chamber. During use of the apparatus the vacuum chamber V is kept at a sufficient vacuum by vacuum pumps (not shown) of appropriate type. The aperture 11a is sealed by a sliding seal formed by sliding seal plate 12 in the middle of which is provided wafer support pillar 13. Pillar 13 supports the fine stage, or short stroke wafer support chuck, 14 which in turn carries the wafer W.

The longstroke motion of the wafer W, by which different areas of it are positioned under the lens (not shown) of the lithographic apparatus for exposure, is accomplished by moving the whole sliding seal plate 12. To this end, the aperture 11a is shaped and dimensioned to accommodate the desired range of movement of the longstroke stage and the pillar 13. In an apparatus intended to expose wafers of 300 mm diameter and with a pillar of 100–150 mm diameter, for example, the aperture 11a might be a square of 480 mm sides to provide room for sensors, etc. around the edge of the wafer. The sliding seal plate 12 must be of a shape and size to maintain a seal over the aperture throughout its entire range of movement, and is in this example therefore also a square of 1200 mm sides, for example. This size allows a seal width of 120 mm each side. A circular aperture and sealing plate may also be suitable.

Sliding seal plate 12 is driven to translate in orthogonal X- and Y-axes as well as to provide rotation, $\phi_z$, about the Z-axis, via beams 15 and drivers 16 provided in motor compartment M.

It will be appreciated that, in use, the major load on the sliding seal plate 12 will be the pressure differential between the vacuum chamber V and the motor compartment M, which is normally kept at atmospheric pressure (or a slightly different pressure in a clean room environment). This upward force (inward) will normally substantially exceed the gravitational force of the weight of the longstroke stage and the other components it carries. Differentially pumped air bearings 21 according to the invention, which are preloaded by the difference between the pressure force and the weight of the sealing plate and the components it supports, are provided around the aperture 11a. To support the sliding seal plate 12 when the vacuum chamber is not evacuated, e.g. for maintenance, supports or bearings 19 mounted on base plate 17 are provided.

Cables 20 providing control and measuring signals, as well as other "utilities", to the shortstroke stage 14 are provided through a hole 12a in the sliding seal plate 12 and the hollow interior of the pillar 13.

To provide an adequate seal around the entire periphery of the aperture 11a, it is necessary to ensure that deformation of the sliding seal plate 12 is kept within acceptable limits. According to this embodiment of the invention this is effected by providing a plate of sintered $Al_2O_3$ (e=3700 kg/m$^3$, E=3.5×10$^{11}$ N/m$^2$, $\upsilon$ (Poisson's ratio)=0.22) of thickness 100 mm. Other suitable materials, such as SiC foam, may also be used.

Embodiment 4

Figure 5:
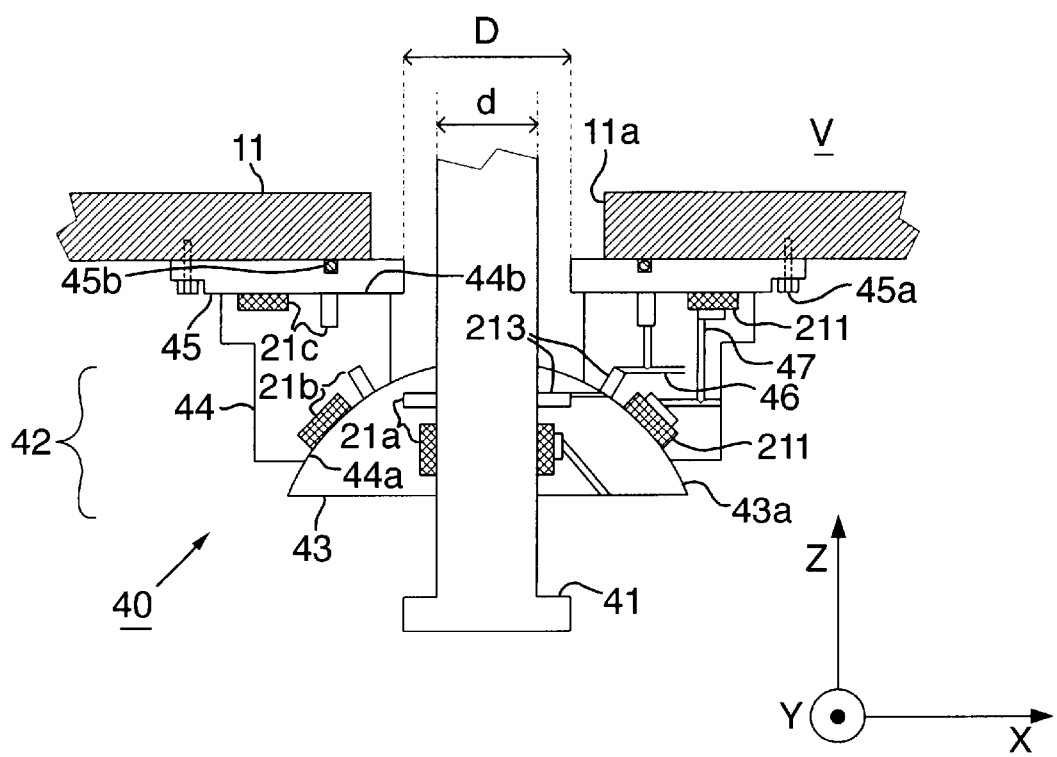
FIG. 5 is a cross-section of an isolation mount according to a fourth embodiment of the invention.

An isolation support 40 according to a fourth embodiment of the invention is shown in FIG. 5. Isolation support 40 is designed to allow an object (not shown) in the vacuum chamber V to be supported whilst being isolated from the vacuum chamber wall 11. The object may be, for example, the metrology frame of a lithography apparatus which is desirably isolated from the vibrations in the vacuum chamber wall 11. The vacuum chamber wall is relatively prone to vibrations derived from the vacuum pumps, etc. which are attached to it.

The object to be supported is mounted on support pillar 41 (which may be one of a plurality of such pillars) which passes through an aperture 11a defined in the vacuum chamber wall 11. The aperture 11a is sealed by a three-part seal 42 which allows the support 41 to move relative to vacuum chamber wall 11 in six degrees of freedom. The three-part seal 42 comprises annular collar 43, seat 44 and plate 45. Collar 43 is provided around the pillar 41 and has a convex hemispherical upper surface 43a. The hemispherical surface 43a sits in a complementary concave hemispherical surface 44a in seat 44. The flat upper surface 44b of the seat lies against plate 45.

Three differential gas bearings 21a, b, c are provided in the interfaces in the three-part seal; one in the collar 43 around the pillar 41, one in the seat 44 around the concave hemispherical surface 44a and one in the seat 44 around the flat upper surface 44b. Bearing 21a allows the pillar 41 to be displaced relative to the seal longitudinally and also to rotate about its axis, providing freedom for the pillar to move parallel to the Z-axis and also allowing $\phi_z$ rotation. Bearing 21b allows the hemispherical collar 43 to rotate about three axes, providing $\phi_x$ and $\phi_y$ rotational freedom, as well as further go freedom. Bearing 21c allows the seat 44 to move sideways relative to plate 45, providing X and Y displacement freedom for the pillar 41.

Each of the bearings 21a, b, c is a differential gas bearing according to the invention and comprises gas feeds 211 and evacuation component 213.

The plate 45 is sealed to the vacuum chamber wall 11 by bolts 45a and, e.g., O-ring 45b in a conventional manner. In use, the pressure differential between the atmosphere and the vacuum chamber V will keep the rest of the seal together, but additional constraints can be provided for when the vacuum is released, e.g. for maintenance.

As described above, the three gas bearings between them allow six degrees of freedom to the pillar 41. The range of movement allowed in each degree will depend, except in the case of $\phi_z$, on the diameters of the pillar, d, and of the aperture in plate 45, D. In this embodiment, which aims to isolate support pillar 41 from vibrations in the vacuum chamber wall, only a relatively small range of movement is necessary.

Embodiment 5

Figure 6:
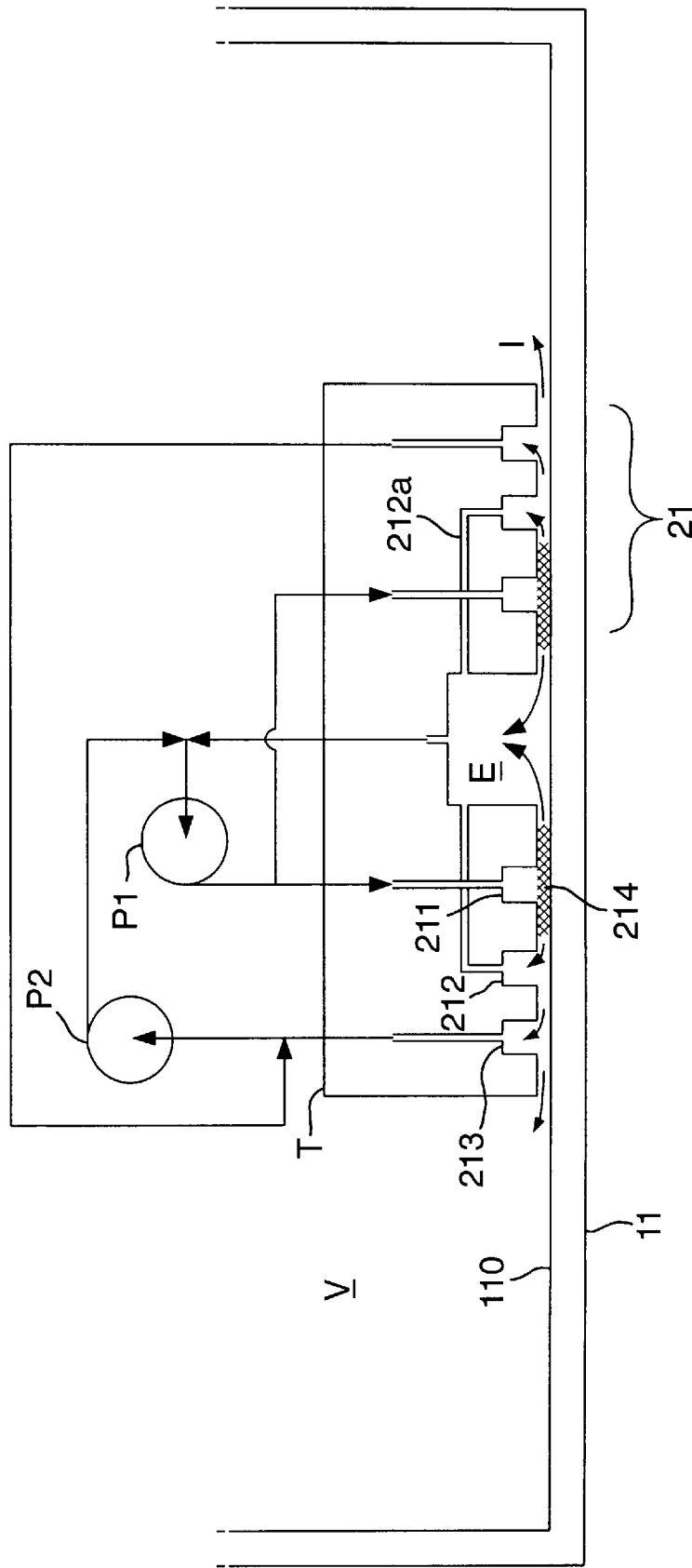
FIG. 6 is a cross-section of a wafer stage according to a fifth embodiment of the present invention.

A part of a lithographic apparatus according to a fifth embodiment of the invention is shown in cross-section in FIG. 6. In this embodiment an object table T, for example the wafer table, is wholly contained within a vacuum chamber V and is moveable about on the floor 110 of the vacuum chamber V by a positioning component (not shown). To enable the movement of the object table T it is supported above the floor 110 of the vacuum chamber V by gas bearing 21 which surrounds the entire periphery of the object table T.

The greater part of the gas provided to high pressure area 214 to form the bearing flows inwardly to expansion chamber E from whence it is drawn by pump P1 and recirculated to the gas supply 211. Some gas will, of course, flow outwardly from high pressure area 214 and the greater part of this flow is interrupted by groove 212 and led back to the expansion chamber E by conduits 212*a*. Such gas as continues to flow outwardly is drawn into evacuation groove 213 by vacuum pump P2 and in this way the residual gas flow 1 into the vacuum chamber V is kept within acceptable limits.

In FIG. 6 the pumps P1 and P2 are shown schematically outside the object table T. They may however be provided in the object table T, to make the table self contained. In that case, a top-up gas supply may be provided in the table also.

The invention is described above in relation to preferred embodiments; however it will be appreciated that the invention is not limited by the above description. In particular, the invention has been described above in relation to the wafer stage of a lithographic apparatus but is equally applicable to the mask stage of such an apparatus or to any apparatus in which a bearing must be provided in a vacuum chamber.

We claim:

1. A lithographic projection apparatus, comprising:
    a radiation system constructed to supply a projection beam of radiation;
    a first object table provided with a mask holder to hold a mask;
    a second object table provided with a substrate holder to hold a substrate;
    a projection system constructed and arranged to image an irradiated portion of the mask onto a target portion of the substrate;
    a vacuum chamber having a wall enclosing at least one of said first and second object tables, said vacuum chamber wall having an aperture therein;
    a moveable sealing member constructed and arranged to seal said aperture;
    a bearing constructed and arranged to bear said sealing member and maintain a gap between said sealing member and said vacuum chamber wall, said bearing comprising:
    a gas bearing adapted to provide pressurized gas into said gap thereby to generate forces tending to hold said sealing member away from said vacuum chamber wall; and
    an evacuation system spaced apart from said gas bearing constructed and arranged to remove said gas from said gap.

2. An apparatus according to claim 1, wherein said sealing member comprises a sealing plate moveable parallel to said vacuum chamber wall; and said gas bearing and evacuation system are provided in said vacuum chamber wall to surround said aperture.

3. A lithographic projection apparatus, comprising:
    a radiation system constructed to supply a projection beam of radiation;
    a first object table provided with a mask holder to hold a mask;
    a second object table provided with a substrate holder to hold a substrate;
    a projection system constructed and arranged to image an irradiated portion of the mask onto a target portion of the substrate;
    a vacuum chamber having a wall enclosing at least one of said first and second object tables, said at least one object table being movable; and
    a bearing adapted to displaceably bear said at least one object table against a bearing surface within said vacuum chamber and maintaining a gap therebetween, the bearing comprising:
    a gas bearing adapted to provide pressurised gas into said gap thereby to generate forces tending to separate said at least one object table from said bearing surface; and
    an evacuation system spaced apart from said gas bearing constructed and arranged to remove gas from said gap, said evacuating system being provided to surround said gas bearing.

4. An apparatus according to claim 1, further comprising a conduit providing a fluid communication between said gap and a reservoir at a pressure higher than that of said vacuum chamber and lower than that of said pressurized gas.

5. An apparatus according to claim 4, wherein said conduit comprises an elongate groove in one surface defining said gap.

6. An apparatus according to claim 1, wherein a distance along said gap between a point of supply of gas to form said gas bearing and said evacuation system is greater than a distance between said evacuation system and an adjacent vacuum chamber.

7. An apparatus according to claim 1, wherein said evacuation system comprises an elongate vacuum groove in one surface defining said gap; a vacuum pump; and vacuum conduits connecting said elongate vacuum groove to said vacuum pump.

8. An apparatus according to claim 7, wherein said evacuation system further comprises at least one second elongate vacuum groove generally parallel to said elongate vacuum groove and provided on the other side thereof than said gas bearing, a second vacuum pump and vacuum conduits connecting said second elongate vacuum groove to said second vacuum pump, said second vacuum pump drawing a deeper vacuum than said vacuum pump.

9. An apparatus according to claim 1, wherein said gas bearing comprises an elongate groove in one surface defining said gap; and gas supply conduits structured to supply gas under pressure to said elongate groove.

10. An apparatus according to claim 1, wherein said gas bearing comprises a plurality of spaced apart indentations in one surface defining said gap, said indentations being filled with porous material; and gas supply conduits structured to supply gas under pressure to said indentations.

11. A method of manufacturing a device using a lithographic projection apparatus, comprising:
    supplying a projection beam of radiation;

holding a mask with a mask holder of a first object table;

holding a substrate with a substrate holder of a second object table;

imaging an irradiated portion of the mask onto a target portion of the substrate;

sealing an aperture defined by a wall of a vacuum chamber of said lithographic projection apparatus with a movable sealing member, said wall of said vacuum chamber enclosing at least one of said first and second object tables;

providing pressurized gas into a gap between said sealing member and said vacuum chamber wall to generate forces tending to hold said sealing member away from said vacuum chamber wall;

removing said gas from said gap; and exposing said substrate to an image of said mask.

12. A device manufactured according to the method of claim 11.

13. An apparatus according to claim 3, further comprising a conduit providing a fluid communication between said gap and a reservoir at a pressure higher than that of said vacuum chamber and lower than that of said pressurized gas.

14. An apparatus according to claim 13, wherein said conduit comprises an elongate groove in one surface defining said gap.

15. An apparatus according to claim 3, wherein a distance along said gap between a point of supply of gas to form said gas bearing and said evacuation system is greater than a distance between said evacuation system and an adjacent vacuum chamber.

16. An apparatus according to claim 3, wherein said evacuation system comprises an elongate vacuum groove in one surface defining said gap; a vacuum pump; and vacuum conduits connecting said elongate vacuum groove to said vacuum pump.

17. An apparatus according to claim 16, wherein said evacuation system further comprises at least one second elongate vacuum groove generally parallel to said elongate vacuum groove and provided on the other side thereof than said gas bearing, a second vacuum pump and vacuum conduits connecting said second elongate vacuum groove to said second vacuum pump, said second vacuum pump drawing a deeper vacuum than said vacuum pump.

18. An apparatus according to claim 3, wherein said gas bearing comprises an elongate groove in one surface defining said gap; and gas supply conduits structured to supply gas under pressure to said elongate groove.

19. An apparatus according to claim 3, wherein said gas bearing comprises a plurality of spaced apart indentations in one surface defining said gap, said indentations being filled with porous material; and gas supply conduits structured to supply gas under pressure to said indentations.

20. An apparatus according to claim 1, further comprising a support pillar passing through the aperture;

wherein said sealing member comprises a seat displaceable relative to said vacuum chamber wall in at least one degree of freedom and a collar displaceable relative to said seat in at least one degree of freedom, said collar supporting said support pillar;

wherein said bearing is adapted to bear said seat relative to said vacuum chamber wall by providing pressurized gas to a gap between said seat and said vacuum chamber wall and to remove gas from the gap between said seat and said vacuum chamber; and wherein said bearing is adapted to bear said collar relative to said seat by providing pressurized gas to a gap between said collar and said seat and to remove gas from the gap between said collar and said seat.

21. An apparatus according to claim 20, wherein said bearing is adapted to bear said support pillar relative to said collar by providing pressurized gas to a gap between said collar and said support pillar and to remove gas from the gap between said collar and said support pillar.

22. An apparatus according to claim 21, wherein said seat is displaceable relative to said vacuum chamber wall in at least two degrees of freedom, said collar is displaceable relative to said seat in at least two degrees of freedom and said support pillar is displaceable relative to said collar in at least two degrees of freedom.

23. A method according to claim 11, comprising removing said gas from said gap using a pressure higher than that of said vacuum chamber and lower than that of said pressurised gas.

24. A method of manufacturing a device using a lithographic projection apparatus, comprising:

supplying a projection beam of radiation;

holding a mask with a mask holder of a first object table;

holding a substrate with a substrate holder of a second object table;

imaging an irradiated portion of the mask onto a target portion of the substrate;

displaceably bearing at least one of said first and second object tables, in a vacuum chamber, against a bearing surface;

providing pressurised gas into a gap between said bearing surface and said at least one object table to generate forces tending to separate said at least one object table from said bearing surface and maintaining the gap therebetween;

removing gas from said gap; and exposing said substrate to an image of said mask.

25. A method according to claim 24, comprising removing said gas from said gap using a pressure higher than that of said vacuum chamber and lower than that of said pressurised gas.

* * * * *